US012363883B2

(12) United States Patent
Sakui et al.

(10) Patent No.: US 12,363,883 B2
(45) Date of Patent: Jul. 15, 2025

(54) MEMORY DEVICE USING SEMICONDUCTOR ELEMENT

(71) Applicant: Unisantis Electronics Singapore Pte. Ltd., Singapore (SG)

(72) Inventors: Koji Sakui, Tokyo (JP); Masakazu Kakumu, Tokyo (JP); Nozomu Harada, Tokyo (JP)

(73) Assignee: UNISANTIS ELECTRONICS SINGAPORE PTE. LTD., Singapore (SG)

( * ) Notice: Subject to any disclaimer, the term of this patent is extended or adjusted under 35 U.S.C. 154(b) by 182 days.

(21) Appl. No.: 18/461,940

(22) Filed: Sep. 6, 2023

(65) Prior Publication Data
US 2024/0081040 A1 Mar. 7, 2024

(30) Foreign Application Priority Data
Sep. 7, 2022 (WO) .................. PCT/JP2022/033567

(51) Int. Cl.
*H10B 12/00* (2023.01)
*G11C 11/404* (2006.01)
(Continued)

(52) U.S. Cl.
CPC ............ *H10B 12/20* (2023.02); *G11C 11/404* (2013.01); *G11C 11/406* (2013.01); *G11C 11/4091* (2013.01); *G11C 11/4096* (2013.01)

(58) Field of Classification Search
CPC . G11C 11/404; G11C 11/406; G11C 11/4091; G11C 11/4096
(Continued)

(56) References Cited

U.S. PATENT DOCUMENTS 12,125,520 B2 * 10/2024 Kakumu ................ H10B 12/20
2003/0111681 A1 6/2003 Kawanaka
(Continued)

FOREIGN PATENT DOCUMENTS

JP H02188966 A 7/1990
JP H03171768 A 7/1991
(Continued)

OTHER PUBLICATIONS

International Search Report and Written Opinion (Japanese and English Translation) in PCT/JP2022/033567, dated Oct. 24, 2022 (13 pages).
(Continued)

*Primary Examiner* — Connie C Yoha
(74) *Attorney, Agent, or Firm* — Crowell & Moring LLP (57) ABSTRACT

A memory device includes pages in a column direction on a substrate and memory cells in each page in a row direction in plan view. Each memory cell includes a semiconductor base, first and second impurity regions at both ends of the semiconductor base, and first and second gate conductor layers. A page erase operation, a page write operation, and a page read operation are performed by controlling voltages applied to the first and second impurity regions and the first and second gate conductor layers. In a first page group including at least one page, a refresh operation of increasing positive holes is performed in a memory cell storing logical data "1". The refresh operation is performed continuously to an N-th page group.

15 Claims, 8 Drawing Sheets (51) Int. Cl.
  *G11C 11/406* (2006.01)
  *G11C 11/4091* (2006.01)
  *G11C 11/4096* (2006.01)
(58) Field of Classification Search
  USPC .......................................................... 365/184
  See application file for complete search history.

(56) References Cited

U.S. PATENT DOCUMENTS

| | | | |
|---|---|---|---|
| 2008/0137394 | A1 | 6/2008 | Shimano et al. |
| 2023/0108227 | A1* | 4/2023 | Kakumu ................ H10B 12/20 365/184 |
| 2023/0377638 | A1 | 11/2023 | Hong |

FOREIGN PATENT DOCUMENTS

| | | | |
|---|---|---|---|
| JP | 7057032 | B1 | 4/2022 |
| WO | WO 2022/162870 | A1 | 8/2022 |

OTHER PUBLICATIONS

Takato, H., et al., "Impact of Surrounding Gate Transistor (SGT) for Ultra-High-Density LSI's", *IEEE Transactions on Electron Devices*, vol. 38, No. 3, Mar. 1991, pp. 573-578 (6 pages).

Chung, H., et al., "Novel $4F^2$ DRAM Cell with Vertical Pillar Transistor(VPT)" *2011 Proceedings of the European Solid-State Device Research Conference* (2011) (4 pages).

Wong, H.S., P., et al., "Phase Change Memory" *Proceedings of the IEEE*, vol. 98, No. 12, Dec. 2010, pp. 2201-2227 (27 pages).

Tsunoda, K., et al., "Low Power and High Speed Switching of Ti-doped NiO ReRAM under the Unipolar Voltage Source of less than 3 V" IEDM (2007) pp. 767-770, (4 pages).

Kang, W., et al., "Reconfigurable Codesign of STT-MRAM Under Process Variations in Deeply Scaled Technology" *IEEE Transactions on Electron Devices*, vol. 62, No. 6, Jun. 2015, pp. 1769-1777 (9 pages).

Ertosun, M. G., et al., "Novel Capacitorless Single-Transistor Charge-Trap DRAM 1T CT DRAM) Utilizing Electrons" *IEEE Electron Device Letters*, vol. 31, No. 5, May 2010, pp. 405-407 (3 pages).

Wan, J., et al., "A Compact Capacitor-Less High-Speed DRAM Using Field Effect-Controlled Charge Regeneration" *IEEE Electron Device Letters*, vol. 33, No. 2, Feb. 2012, pp. 179-181 (3 pages).

Ohsawa, T., et al., "Memory Design Using A One-Transistor Gain Cell on SOI," IEEE JSSC, vol. 37, No. 11, pp. 1510-1522 (2002) (13 pages).

Shino, T., et al., "Floating Body RAM Technology and its Scalability to 32nm Node and Beyond", IEEE IEDM (2006) (4 pages).

Song, J., et al., "Design Optimization of Gate-All-Around (GAA) MOSFETs" *IEEE Transactions on Nanotechnology*, vol. 5, No. 3, pp. 186-191, May 2006 (7 pages).

Loubet, N., et al., "Stacked Nanosheet Gate-All-Around Transistor to Enable Scaling Beyond FinFET" *2017 Symposium on VLSI Technology Digest of Technical Papers*, T230-T231, Jun. 2017 (2 pages).

Jiang, H., et al., "Experimental Investigation of Self-Heating Effect (SHE) in Multiple-Fin SOI FinFETS" *Semicond. Sci. Technol.* 29 (2014) 115021 (9 pages).

Yoshida, E., et al., "A Capacitorless 1T-DRAM Technology Using Gate-Induced Drain-Leakage (GIDL) Current for Low-Power and High-Speed Embedded Memory" *IEEE Transactions on Electron Devices*, vol. 53, No. 4, Apr. 2006 (6 pages).

Morishita, F., et al., "A Capacitorless Twin-Transistor Random Access Memory (TTRAM) on SOI" *IEICE Trans. Electron.*, vol. E90-C, No. 4, Apr. 2007, pp. 765-771 (7 pages).

Sakui, K., et al., "Dynamic Flash Memory with Dual Gate Surrounding Gate Transistor (SGT) for Computation In Memory" *Proc. IEEE IMW*, pp. 127-128 (2021) (2 pages).

* cited by examiner

MEMORY DEVICE USING SEMICONDUCTOR ELEMENT

CROSS REFERENCES TO RELATED APPLICATIONS

This application claims priority to PCT/JP2022/033567, filed Sep. 7, 2022, the entire content of which is incorporated herein by reference.

BACKGROUND OF THE INVENTION

1. Field of the Invention

The present invention relates to a memory device using a semiconductor element.

2. Description of the Related Art

In recent years, there has been a demand for higher integration and higher performance of memory elements in the development of LSI (Large Scale Integration) technology.

Higher density and higher performance of memory elements are being pursued. An SGT (Surrounding Gate Transistor, see Japanese Unexamined Patent Application Publication No. 2-188966 and Hiroshi Takato, Kazumasa Sunouchi, Naoko Okabe, Akihiro Nitayama, Katsuhiko Hieda, Fumio Horiguchi, and Fujio Masuoka: IEEE Transactions on Electron Devices, Vol. 38, No. 3, pp. 573-578 (1991)) is used as a selection transistor for a DRAM (Dynamic Random Access Memory, see, for example, H. Chung, H. Kim, H. Kim, K. Kim, S. Kim, K. W. Song, J. Kim, Y. C. Oh, Y. Hwang, H. Hong, G. Jin, and C. Chung: "Novel 4F2 DRAM Cell with Vertical Pillar Transistor (VPT)," 2011 Proceedings of the European Solid-State Device Research Conference, (2011)) to which a capacitor is connected, a PCM (Phase Change Memory, see, for example, H. S. Philip Wong, S. Raoux, S. Kim, J. Liang, J. P. Reifenberg, B. Rajendran, M. Asheghi, and K. E. Goodson: "Phase Change Memory," Proceedings of IEEE, Vol. 98, No. 12, December, pp. 2201-2227 (2010)) to which a resistance change element is connected, an RRAM (Resistive Random Access Memory, for example, see K. Tsunoda, K. Kinoshita, H. Noshiro, Y. Yamazaki, T. Iizuka, Y. Ito, A. Takahashi, A. Okano, Y. Sato, T. Fukano, M. Aoki, and Y. Sugiyama: "Low Power and High Speed Switching of Ti-doped NiO ReRAM under the Unipolar Voltage Source of less than 3 V," IEDM (2007)), an MRAM (Magnetoresistive Random Access Memory, see, for example, W. Kang, L. Zhang, J. Klein, Y. Zhang, D. Ravelosona, and W. Zhao: "Reconfigurable Codesign of STT-MRAM Under Process Variations in Deeply Scaled Technology," IEEE Transactions on Electron Devices, Vol. 62, No. 6, pp. 1769-1777_(2015)) in which resistance is changed by changing the direction of magnetic spin by a current, and the like.

There is also a DRAM memory cell that does not have a capacitor and is constituted by one MOS (metal-oxide-semiconductor) transistor (see Japanese Unexamined Patent Application Publication No. 3-171768, M. G. Ertosun, K. Lim, C. Park, J. Oh, P. Kirsch, and K. C. Saraswat: "Novel Capacitorless Single-Transistor Charge-Trap DRAM (1T CT DRAM) Utilizing Electrons," IEEE Electron Device Letters, Vol. 31, No. 5, pp. 405-407 (2010), J. Wan, C. Le Royer, A. Zaslavsky, and S. Critoloveanu: "A Compact Capacitor-Less High-Speed DRAM Using Field Effect-Controlled Charge Regeneration," IEEE Electron Device Letters, Vol. 33, No. 2, pp. 179-181 (2012), T. Ohsawa, K. Fujita, T. Higashi, Y. Iwata, T. Kajiyama, Y. Asao, and K. Sunouchi: "Memory design using a one-transistor gain cell on SOI," IEEE JSSC, Vol. 37, No. 11, pp. 1510-1522 (2002), T. Shino, N. Kusunoki, T. Higashi, T. Ohsawa, K. Fujita, K. Hatsuda, N. Ikumi, F. Matsuoka, Y. Kajitani, R. Fukuda, Y. Watanabe, Y. Minami, A. Sakamoto, J. Nishimura, H. Nakajima, M. Morikado, K. Inoh, T. Hamamoto, and A. Nitayama: "Floating Body RAM Technology and its Scalability to 32 nm Node and Beyond," IEEE IEDM (2006), and E. Yoshida and T. Tanaka: "A Capacitorless 1T-DRAM Technology Using Gate-Induced Drain-Leakage (GIDL) Current for Low-Power and High-Speed Embedded Memory," IEEE IEDM (2003)). For example, among a group of positive holes and electrons generated by an impact ionization phenomenon in a channel by a current between a source and a drain of an N-channel MOS transistor, some or all of the group of positive holes are retained in the channel to write logical storage data "1". Then, the group of positive holes are discharged from the channel to write logical storage data "0". With this memory cell, memory cells in which "1" is written and memory cells in which "0" is written are present at random with respect to a common selected word line. When an ON voltage is applied to the selected word line, a floating body channel voltage of a selected memory cell connected to the selected word line greatly varies due to capacitive coupling between a gate electrode and the channel. With this memory cell, it is an object to improve a decrease in an operation margin due to a variation in the floating body channel voltage and to improve a decrease in data retention characteristics due to discharge of some of the group of positive holes, which are signal charges accumulated in the channel.

In addition, there are twin-transistor MOS transistor memory elements in which one memory cell is formed in an SOI layer by using two MOS transistors (for example, see US2008/0137394 A1, US2003/0111681 A1, and F. Morishita, H. Noda, I. Hayashi, T. Gyohten, M. Okamoto, T. Ipposhi, S. Maegawa, K. Dosaka, and K. Arimoto: "A Capacitorless Twin-Transistor Random Access Memory (TTRAM) on SOI," IEICE Trans. Electron., Vol. E90-c., No. 4 pp. 765-771 (2007)). In these elements, an $N^+$ layer that divides floating body channels of the two MOS transistors and serves as a source or a drain is formed in contact with an insulating layer on the substrate side. This $N^+$ layer electrically isolates the floating body channels of the two MOS transistors. A group of positive holes, which are signal charges, are accumulated only in the floating body channel of one of the MOS transistors. The other MOS transistor serves as a switch for reading the group of positive holes, which are signal charges accumulated in the one MOS transistor. With this memory cell as well, since the group of positive holes, which are signal charges, are accumulated in the channel of the one MOS transistor, as in the above-described memory cell constituted by the one MOS transistor, it is an object to improve the decrease in the operation margin or to improve the decrease in the data retention characteristics due to the discharge of some of the group of positive holes, which are signal charges, accumulated in the channel.

Figure 3A:
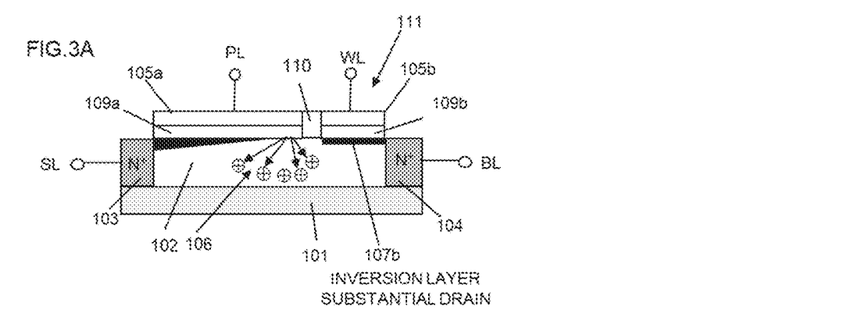
FIGS. 3A, 3B, 3C and 3D are diagrams for explaining a dynamic flash memory of the related art.

In addition, as illustrated in FIG. 3A, there is a dynamic flash memory cell 111 that does not have a capacitor and is constituted by a MOS transistor (see Japanese Patent No. 7057032 and K. Sakui and N. Harada: "Dynamic Flash Memory with Dual Gate Surrounding Gate Transistor (SGT)," Proc. IEEE IMW, pp. 72-75 (2021)). As illustrated in FIG. 3A, on an SiO$_2$ layer 101 of an SOI substrate, a floating body semiconductor base 102 is provided. An N$^+$ layer 103 connected to a source line SL and an N$^+$ layer 104 connected to a bit line BL are provided at both ends of the floating body semiconductor base 102. Furthermore, a first gate insulating layer 109a is connected to the N$^+$ layer 103 and covers the floating body semiconductor base 102. A second gate insulating layer 109b is connected to the N$^+$ layer 104, is connected to the first gate insulating layer 109a with a slit insulating film 110 interposed therebetween, and covers the floating body semiconductor base 102. In addition, a first gate conductor layer 105a covers the first gate insulating layer 109a and is connected to a plate line PL, and a second gate conductor layer 105b covers the second gate insulating layer 109b and is connected to a word line WL. The slit insulating film 110 is between the first gate conductor layer 105a and the second gate conductor layer 105b. Thus, the memory cell 111 of a dynamic flash memory (DEFM) is formed. Note that the source line SL may be connected to the N$^+$ layer 104, and the bit line BL may be connected to the N$^+$ layer 103.

Figure 3B:
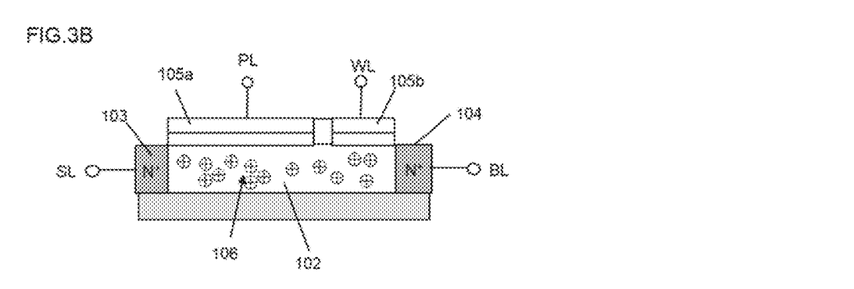

As illustrated in FIG. 3A, for example, a zero voltage is applied to the N$^+$ layer 103 and a positive voltage is applied to the N$^+$ layer 104 to operate a first N-channel MOS transistor region in a saturation region and to operate a second N-channel MOS transistor region in a linear region. The first N-channel MOS transistor region is constituted by the floating body semiconductor base 102 covered with the first gate conductor layer 105a, and the second N-channel MOS transistor region is constituted by the floating body semiconductor base 102 covered with the second gate conductor layer 105b. As a result, no pinch-off point is present in the second N-channel MOS transistor region, and an inversion layer 107b is formed on the entire surface. The inversion layer 107b formed under the second gate conductor layer 105b connected to the word line WL functions as a substantial drain of the first N-channel MOS transistor region. As a result, the electric field is maximized in the boundary region of the semiconductor base between the first N-channel MOS transistor region and the second N-channel MOS transistor region, and the impact ionization phenomenon occurs in this region. Then, as illustrated in FIG. 3B, a memory write operation is performed by discharging, from the floating body semiconductor base 102, a group of electrons among a group of electrons and positive holes generated by the impact ionization phenomenon, and retaining some or all of a group of positive holes 106 in the floating body semiconductor base 102. This state corresponds to the logical storage data "1".

Figure 3C:
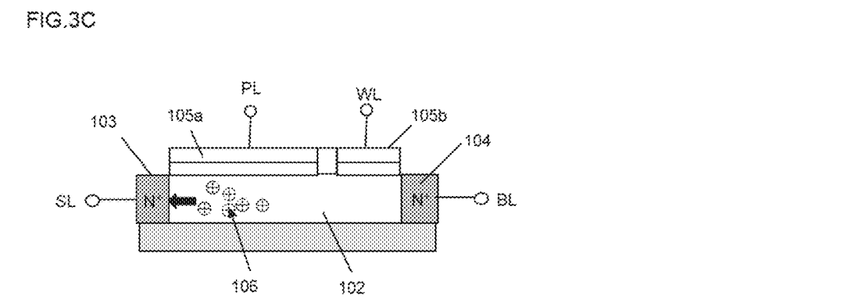
Figure 3D:
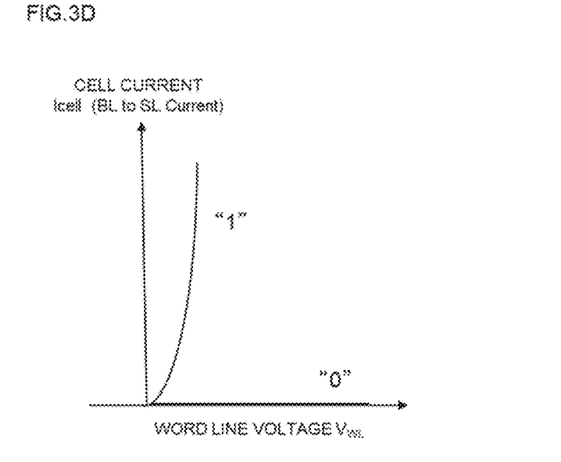

Then, as illustrated in FIG. 3C, for example, a positive voltage is applied to the plate line PL, a zero voltage is applied to the word line WL and the bit line BL, and a negative voltage is applied to the source line SL to discharge the group of positive holes 106 from the floating body semiconductor base 102, thereby performing an erase operation. This state corresponds to the logical storage data "0". By setting the voltage applied to the first gate conductor layer 105a connected to the plate line PL to be higher than a threshold voltage at the time of the logical storage data "1" and lower than a threshold voltage at the time of the logical storage data "0", as illustrated in FIG. 3D, a characteristic is obtained in which no current flows even when the voltage of the word line WL is increased at the time of reading the logical storage data "0". With this characteristic, the operation margin can be largely expanded as compared with the above-described memory cells. In the memory cell 111, since the channels of the first and second N-channel MOS transistor regions, in which gates are the first gate conductor layer 105a connected to the plate line PL and the second gate conductor layer 105b connected to the word line WL, are connected to each other by the floating body semiconductor base 102, the voltage variation of the floating body semiconductor base 102 when a selection pulse voltage is applied to the word line WL is largely suppressed. This significantly improves the above-described problem in the above-described memory cells, which is the decrease in the operation margin or the decrease in the data retention characteristics due to the discharge of some of the group of positive holes, which are signal charges accumulated in the channel. In the future, further improvement will be required for the characteristics of this memory element.

SUMMARY OF THE INVENTION

In a dynamic flash memory cell, a refresh operation for retaining logical data of the memory cell is required.

In order to achieve the above object, a memory device using a semiconductor element according to an aspect of the present invention is a memory device in which, in plan view, a plurality of pages are arranged in a column direction on a substrate, each of the plurality of pages including a plurality of memory cells arranged in a row direction, in which each of the memory cells included in each of the pages includes:

a semiconductor base standing vertically or extending horizontally on the substrate;

a first impurity region and a second impurity region at both ends of the semiconductor base;

a gate insulating layer in contact with a side surface of the semiconductor base between the first impurity region and the second impurity region;

a first gate conductor layer covering a part or an entirety of the gate insulating layer; and a second gate conductor layer adjacent to the first gate conductor layer and in contact with a side surface of the gate insulating layer, a page erase operation, a page write operation, and a page read operation are to be performed by controlling voltages applied to the first impurity region, the second impurity region, the first gate conductor layer, and the second gate conductor layer, among the memory cells, in any memory cell storing logical data "1" in a first page group including at least one page of the pages, a refresh operation is to be performed, the refresh operation being an operation in which a number of positive holes of a group of positive holes in the semiconductor base is increased by an impact ionization phenomenon with a current flowing from the second impurity region to the semiconductor base, and in a state in which the voltage applied to the second impurity region is fixed, the refresh operation in which the number of positive holes is increased by the impact ionization phenomenon is to be performed continuously from the first page group to an N-th page group (N is a given integer of 2 or more) (first invention).

In the first invention above, in each of the memory cells, the first impurity region is connected to a source line, the second impurity region is connected to a bit line, one of the first gate conductor layer and the second gate conductor layer is connected to a word line, and an other of the first gate conductor layer and the second gate conductor layer is connected to a plate line (second invention).

In the second invention above, in the page erase operation to be performed by controlling voltages applied to the source line, the bit line, the word line, and the plate line, some of the group of positive holes in the semiconductor base of the memory cells of the page are eliminated to reduce the number of positive holes remaining in the semiconductor base, and in the page write operation to be performed by controlling the voltages applied to the source line, the bit line, the word line, and the plate line, the number of positive holes remaining in the semiconductor base of a selected memory cell among the memory cells of the page is increased by the impact ionization phenomenon (third invention).

In the second invention above, when the refresh operation is performed continuously from the first page group to the N-th page group, in a state in which the voltage applied to the bit line is fixed, all the word lines, all the plate lines, and all the source lines belonging to each of the first page group to the N-th page group are selected (fourth invention).

In the first invention above, all storage data after the page erase operation becomes logical data "0", and storage data after the page write operation becomes the logical data "1" in the memory cell storing the logical data "1" (fifth invention).

In the second invention above, the word line and the plate line are arranged in parallel in plan view, and the bit line is arranged in a direction perpendicular to the word line and the plate line in plan view (sixth invention).

In the second invention above, a first gate capacitance between the semiconductor base and the other of the first gate conductor layer and the second gate conductor layer, to which the plate line is connected, with a first gate insulating layer interposed therebetween is larger than a second gate capacitance between the semiconductor base and the one of the first gate conductor layer and the second gate conductor layer, to which the word line is connected, with a second gate insulating layer interposed therebetween (seventh invention).

In the second invention above, the source line is isolated for each of the memory cells arranged in the row direction and is arranged in parallel with the word line and the plate line in plan view (eighth invention).

In the second invention above, the source line is connected in common to all the memory cells of adjacent pages among the pages in plan view (ninth invention).

In the first invention above, the semiconductor base is a P-type semiconductor layer, and the first impurity region and the second impurity region are N-type semiconductor layers (tenth invention).

In the first invention above, data in all the memory cells connected to at least two pages among the pages is erased in the page erase operation (eleventh invention).

In the second invention above, the word line and the plate line are connected to a row decoder circuit, a row address is to be input to the row decoder circuit, and any page among the pages is to be selected in accordance with the row address (twelfth invention).

In the first invention above, the bit line is connected to a sense amplifier circuit with a switch circuit interposed therebetween, the sense amplifier circuit is connected to a column decoder circuit, a column address is to be input to the column decoder circuit, and the sense amplifier circuit is to be selectively connected to an input/output circuit in accordance with the column address (thirteenth invention).

In the first invention above, one or both of the first gate conductor layer and the second gate conductor layer are divided into two or more isolated gate conductor layers in plan view or in a vertical direction, and the isolated gate conductor layers are to be operated synchronously or asynchronously (fourteenth invention).

In the fourteenth invention above, in plan view or in the vertical direction, the isolated gate conductor layers of one of the first gate conductor layer and the second gate conductor layer are arranged on both sides of an other of the first gate conductor layer and the second gate conductor layer (fifteenth invention).

DESCRIPTION OF THE PREFERRED EMBODIMENTS

A memory device using a semiconductor element (hereinafter, referred to as a dynamic flash memory) according to an embodiment of the present invention will be described below with reference to the drawings.

First Embodiment

The structure and operation mechanism of a dynamic flash memory cell according to a first embodiment of the present invention will be described with reference to FIG. 1 and FIGS. 2A to 2I. The structure of the dynamic flash memory cell will be described with reference to FIG. 1. Then, a page read operation mechanism capable of performing a refresh operation of logical data "1" and logical data "0" will be described with reference to FIGS. 2A to 2I.

Figure 1:
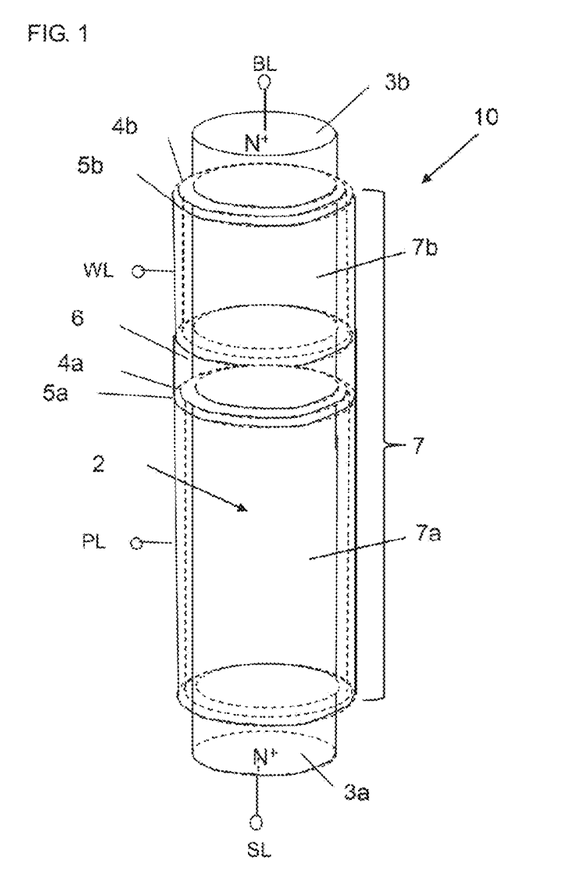
FIG. 1 is a structural diagram of a memory cell having an SGT according to a first embodiment.

FIG. 1 illustrates the structure of the dynamic flash memory cell according to the first embodiment of the present invention. A p-type or i-type (intrinsic type) silicon semiconductor pillar 2 (hereinafter, the silicon semiconductor pillar is referred to as a "Si pillar") (an example of "semiconductor base" in the claims) is formed on a substrate. At upper and lower positions in the Si pillar 2, $N^+$ layers 3a and 3b (examples of "first impurity region" and "second impurity region" in the claims), one of which serves as a source and the other of which serves as a drain, are formed. A portion of the Si pillar 2 between the $N^+$ layers 3a and 3b serving as the source and the drain corresponds to a semiconductor base 7 (an example of "semiconductor base" in the claims). A first gate insulating layer 4a (an example of "first gate insulating layer" in the claims) and a second gate insulating layer 4b (an example of "second gate insulating layer" in the claims) are formed so as to surround the semiconductor base 7. The first gate insulating layer 4a and the second gate insulating layer 4b are in contact with or close to the N⁺ layers 3a and 3b serving as the source and the drain, respectively. A first gate conductor layer 5a (an example of "first gate conductor layer" in the claims) and a second gate conductor layer 5b (an example of "second gate conductor layer" in the claims) are formed so as to surround the first gate insulating layer 4a and the second gate insulating layer 4b, respectively. The first gate conductor layer 5a and the second gate conductor layer 5b are isolated from each other by an insulating layer 6. The semiconductor base 7 between the N⁺ layers 3a and 3b includes a first semiconductor base 7a surrounded by the first gate insulating layer 4a and a second semiconductor base 7b surrounded by the second gate insulating layer 4b. As a result, a dynamic flash memory cell 10 including the N⁺ layers 3a and 3b serving as the source and drain, the semiconductor base 7, the first gate insulating layer 4a, the second gate insulating layer 4b, the first gate conductor layer 5a, and the second gate conductor layer 5b is formed. The N⁺ layer 3a serving as the source, the N⁺ layer 3b serving as the drain, the first gate conductor layer 5a, and the second gate conductor layer 5b are connected to a source line SL (an example of "source line" in the claims), a bit line BL (an example of "bit line" in the claims), a plate line PL (an example of "plate line" in the claims), and a word line WL (an example of "word line" in the claims), respectively. It is desirable to have a structure in which a first gate capacitance (an example of "first gate capacitance" in the claims) of the first gate conductor layer 5a to which the plate line PL is connected be larger than a second gate capacitance (an example of "second gate capacitance" in the claims) of the second gate conductor layer 5b to which the word line WL is connected.

FIGS. 2A to 2I illustrate a mechanism for performing a refresh operation (an example of "refresh operation" in the claims) of the dynamic flash memory cell according to the first embodiment of the present invention.

Figure 2A:
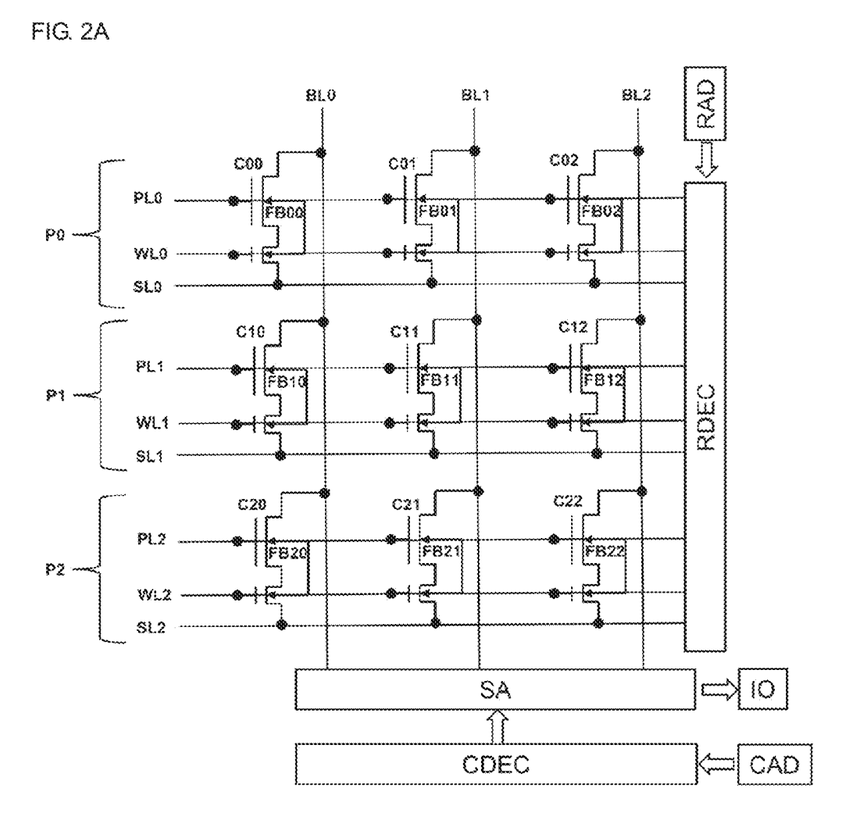
FIG. 2A is a diagram for explaining a refresh operation of a memory device according to the first embodiment.

FIG. 2A is a memory block diagram including a main circuit for explaining the refresh operation. Word lines WL0 to WL2 and plate lines PL0 to PL2 are connected to a row decoder circuit RDEC (an example of "row decoder circuit" in the claims), a row address RAD (an example of "row address" in the claims) is input to the row decoder circuit, and any of pages P0 to P2 is selected according to the row address RAD. In addition, bit lines BL0 to BL2 are connected to a sense amplifier circuit SA (an example of "sense amplifier circuit" in the claims), the sense amplifier circuit SA is connected to a column decoder circuit CDEC (an example of "column decoder circuit" in the claims), a column address CAD (an example of "column address" in the claims) is input to the column decoder circuit CDEC, and the sense amplifier circuit SA is selectively connected to an input/output circuit 10 (an example of "input/output circuit" in the claims) in accordance with the column address CAD.

For memory cells constituting the memory block in FIG. 2A, unlike in FIG. 1, the plate lines PL0 to PL2 are provided on the side of the bit lines BL0 to BL2, and the word lines WL0 to WL2 are provided on the side of source lines SL0 to SL2. A total of nine memory cells C00 to C22 in three rows×three columns are illustrated herein in plan view, but the number of memory cells in an actual memory block is larger than this. When the memory cells are arranged in rows and columns, one direction of the arrangement is referred to as a "row direction" (or "row shape"), and a direction perpendicular to the row direction is referred to as a "column direction" (or "column shape"). The source lines SL0 to SL2, the plate lines PL0 to PL2, and the word lines WL0 to WL2 are arranged in parallel, and the bit lines BL0 to BL2 are arranged in a direction perpendicular to these lines. For example, in this block, it is assumed that the memory cells C10 to C12 to which the plate line PL1, the word line WL1, and the source line SL1 of a given page P1 are connected are selected.

Figure 2B:
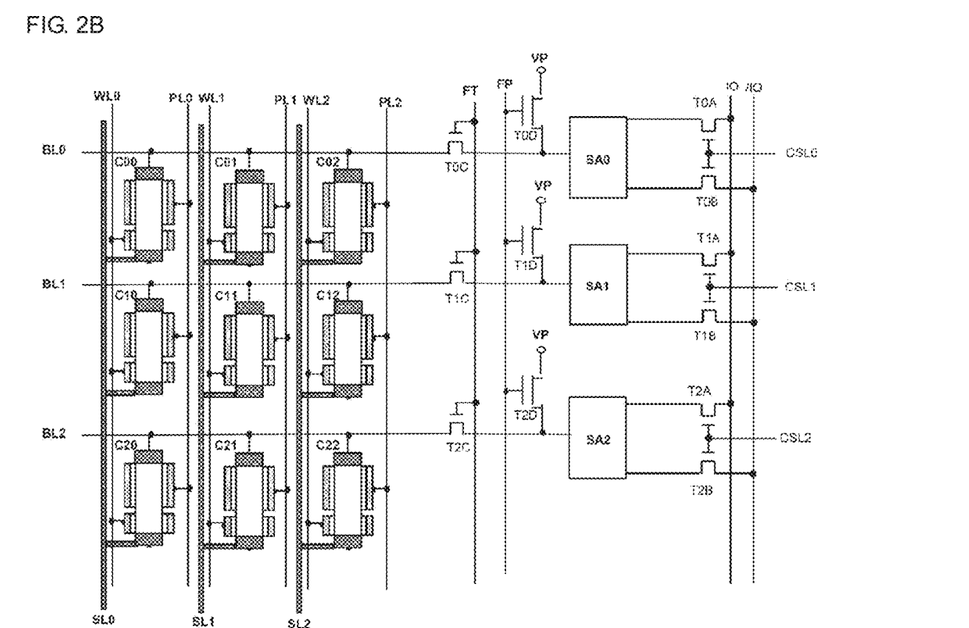
FIG. 2B is a diagram for explaining the refresh operation of the memory device according to the first embodiment.

FIG. 2B illustrates an equivalent circuit of the memory cell block in FIG. 2A in more detail. Each of transistors T0C to T2C having gates that receive a transfer signal FT constitutes a switch circuit (an example of "switch circuit" in the claims). In addition, transistors T0D to T2D having gates connected to a bit line supply signal FP have drains connected to a bit line supply voltage VP and sources connected to the bit lines BL0 to BL2, respectively. The bit lines BL0 to BL2 are connected to sense amplifier circuits SA0 to SA2 via the switch circuits. The sense amplifier circuits SA0 to SA2 are connected to a pair of complementary input/output lines IO and /IO via transistors T0A to T2B having gates connected to column selection lines CSL0 to CSL2.

Figure 2C:
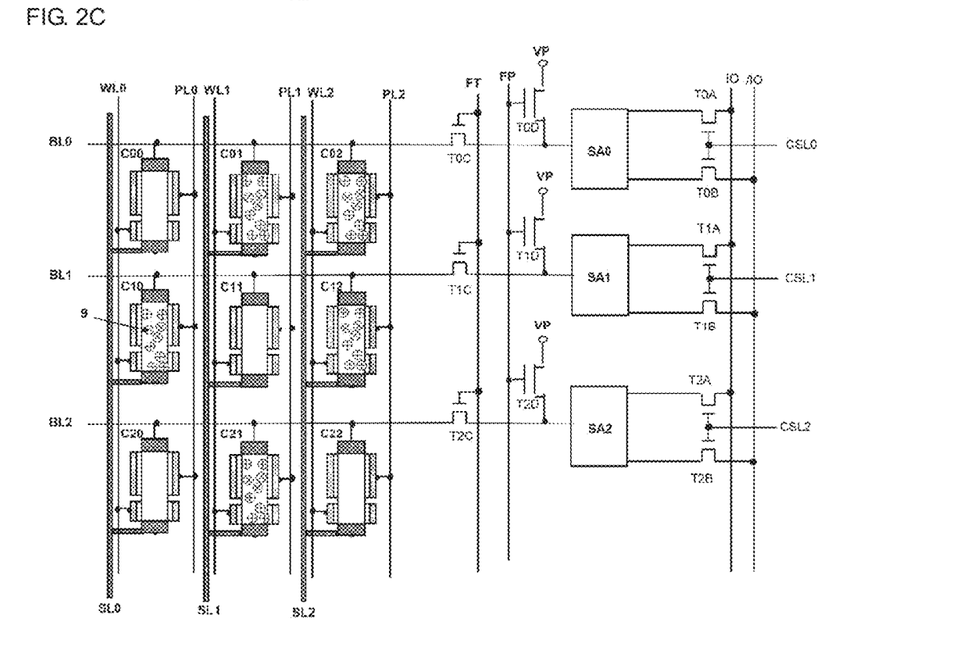
FIG. 2C is a diagram for explaining the refresh operation of the memory device according to the first embodiment.

FIG. 2C illustrates a state in which, at a given timing, among the memory cells C00 to C22, the memory cells C01, C02, C10, C12, and C21 are subjected to "1" writing at random to store the logical data "1" (an example of "logical data "1"" in the claims), and a group of positive holes 9 are accumulated in the semiconductor base 7, and a state in which the group of positive holes 9 are not accumulated in the semiconductor base 7 of the memory cells C00, C11, C20, and C22 that are not subjected to "1" writing, and the logical data "0" (an example of "logical data "0"" in the claims) is stored.

Figure 2D:
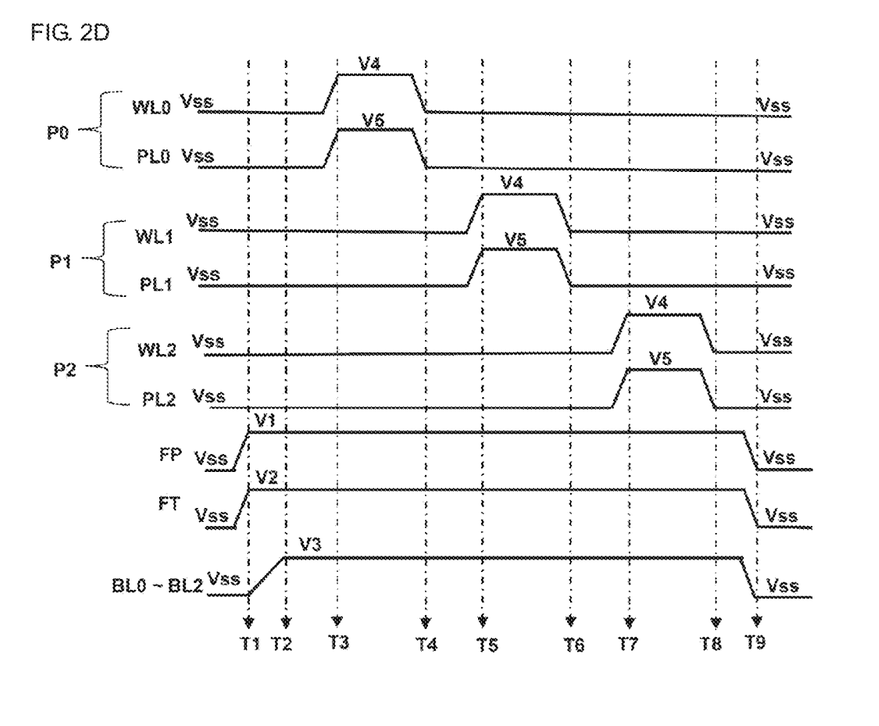
FIG. 2D is a diagram for explaining the refresh operation of the memory device according to the first embodiment.

With reference to the operation waveform diagram in FIG. 2D, a continuous refresh operation will be described. At a first time Ti, the bit line supply signal FP rises from a ground voltage Vss to a first voltage V1. Here, the first voltage V1 is, for example, 2.0 V and the bit line supply voltage VP is, for example, 0.6 V, and thus, the N-type MOS transistors T0D to T2D operate in a linear region. In addition, the transfer signal FT rises from the ground voltage Vss to a second voltage V2. As a result, at a second time T2, the bit lines BL0 to BL2 are charged from the ground voltage Vss to a third voltage V3.

Figure 2E:
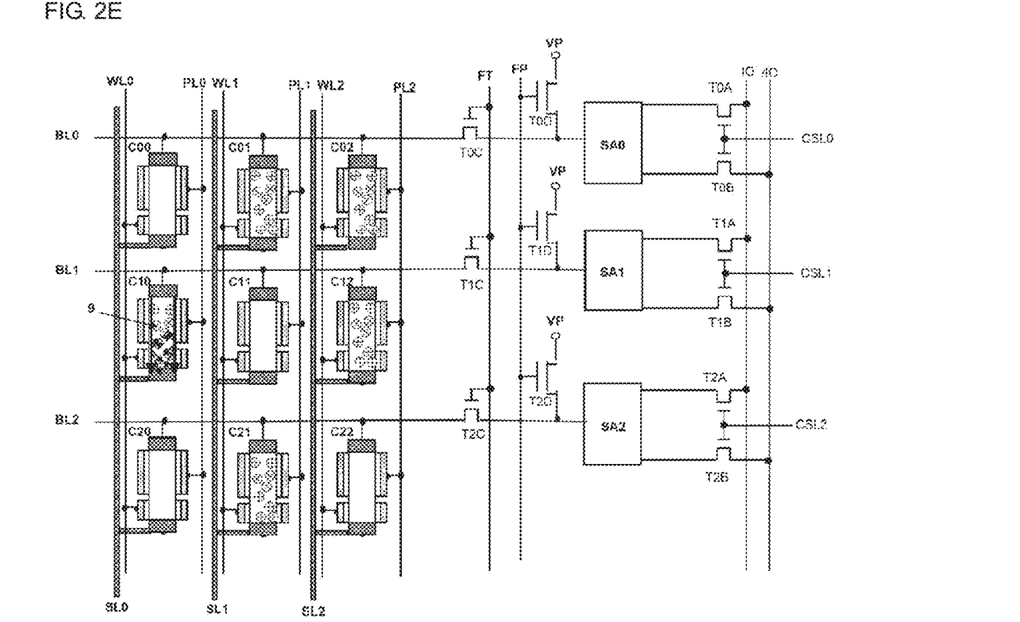
FIG. 2E is a diagram for explaining the refresh operation of the memory device according to the first embodiment.

At a third time T3, the page (an example of "page" in the claims) P0 is selected, and the word line WL0 and the plate line PL0 belonging to the page P0 rise from the ground voltage Vss to a fourth voltage V4 and a fifth voltage V5, respectively. Here, for example, the fourth voltage V4 and the fifth voltage V5 are 1.2 V and 0.9 V, respectively. As illustrated in FIG. 2E, if the threshold voltage of the N-channel MOS transistor region in which the semiconductor base 7 is surrounded by the plate line PL0 of the memory cells C00 and C20 storing the logical data "0" is, for example, 0.9 V or more, a memory cell current does not flow in the memory cells C00 and C20. On the other hand, the threshold voltage of the N-channel MOS transistor region in which the semiconductor base 7 is surrounded by the plate line PL0 of the memory cell C10 storing the logical data "1" is, for example, 0.9 V or less, and the memory cell current flows in the memory cell C10. As a result, the refresh operation for the logical data "1" (an example of "refresh operation" in the claims) is performed, in which the group of positive holes 9 are formed inside the semiconductor base 7 of the memory cell C10 by the impact ionization phenomenon. Therefore, even when the number of positive holes of the group of positive holes 9 accumulated in the semiconductor base 7 is lost due to being left for a long time, the number of positive holes can be increased to the number of positive holes required for the logical data "1", and data retention characteristics of the logical data "1" are improved.

Figure 2F:
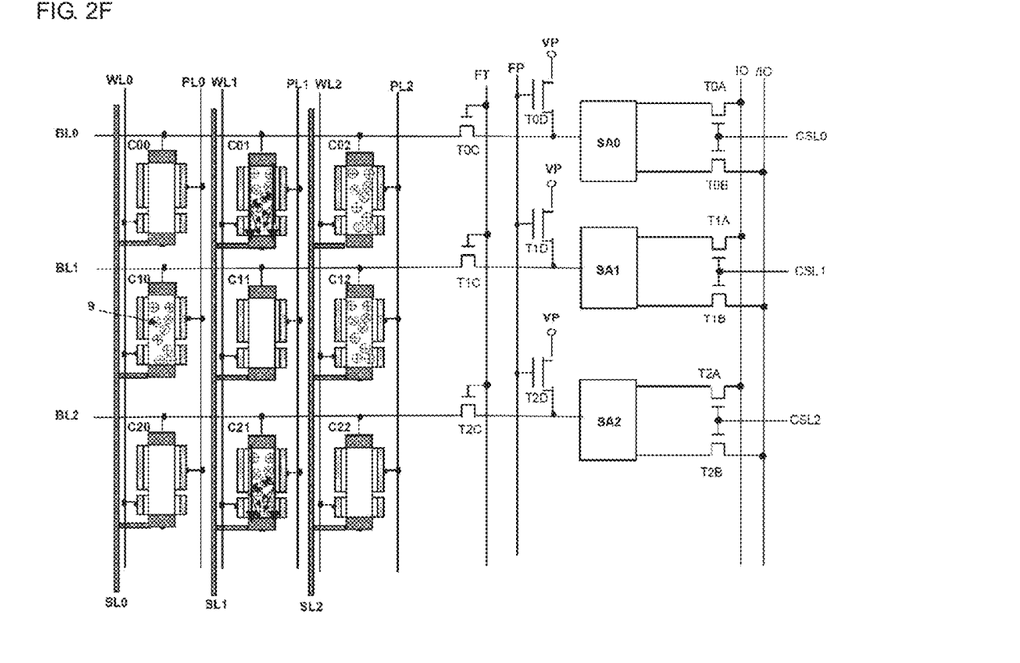
FIG. 2F is a diagram for explaining the refresh operation of the memory device according to the first embodiment.

At a fourth time T4, the word line WL0 and the plate line PL0 fall from the fourth voltage V4 and the fifth voltage V5, respectively, to the ground voltage Vss, and at a fifth time T5, the word line WL1 and the plate line PL1 belonging to the page P1 rise from the ground voltage Vss to the fourth voltage V4 and the fifth voltage V5, respectively. During this period, the voltages of the bit lines BL0 to BL2 are maintained at the third voltage V3. As a result, as illustrated in FIG. 2F, if the threshold voltage of the N-channel MOS transistor region in which the semiconductor base 7 is surrounded by the plate line PL1 of the memory cell C11 storing the logical data "0" is, for example, 0.9 V or more, the memory cell current does not flow in the memory cell C11. On the other hand, the threshold voltage of the N-channel MOS transistor region in which the semiconductor base 7 is surrounded by the plate line PL1 of the memory cells C01 and C21 storing the logical data "1" is, for example, 0.9 V or less, and the memory cell current flows in the memory cells C01 and C21. As a result, the refresh operation for the logical data "1" is performed, in which the group of positive holes 9 are formed inside the semiconductor base 7 of the memory cells C01 and C21 by the impact ionization phenomenon.

Figure 2G:
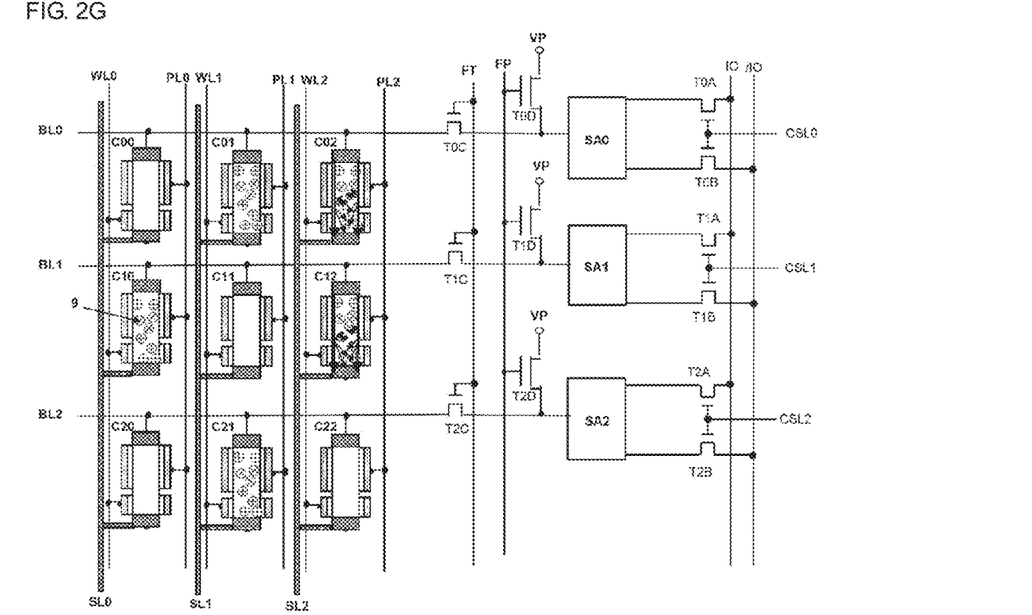
FIG. 2G is a diagram for explaining the refresh operation of the memory device according to the first embodiment.

At a sixth time T6, the word line WL1 and the plate line PL1 fall from the fourth voltage V4 and the fifth voltage V5, respectively, to the ground voltage Vss, and at a seventh time T7, the word line WL2 and the plate line PL2 belonging to the page P2 rise from the ground voltage Vss to the fourth voltage V4 and the fifth voltage V5, respectively. During this period, the voltages of the bit lines BL0 to BL2 are maintained at the third voltage V3. As a result, as illustrated in FIG. 2G, if the threshold voltage of the N-channel MOS transistor region in which the semiconductor base 7 is surrounded by the plate line PL2 of the memory cell C22 storing the logical data "0" is, for example, 0.9 V or more, the memory cell current does not flow in the memory cell C22. On the other hand, the threshold voltage of the N-channel MOS transistor region in which the semiconductor base 7 is surrounded by the plate line PL2 of the memory cells C02 and C12 storing the logical data "1" is, for example, 0.9 V or less, and the memory cell current flows in the memory cells C02 and C12. As a result, the refresh operation for the logical data "1" is performed, in which the group of positive holes 9 are formed inside the semiconductor base 7 of the memory cells C02 and C12 by the impact ionization phenomenon. At an eighth time T8, the word line WL2 and the plate line PL2 fall from the fourth voltage V4 and the fifth voltage V5, respectively, to the ground voltage Vss, and at a ninth time T9, the bit line supply signal FP falls from the first voltage V1 to the ground voltage Vss, the transfer signal FT falls from the second voltage V2 to the ground voltage Vss, and the bit lines BL0 to BL2 fall from the third voltage V3 to the ground voltage Vss, thereby completing the continuous refresh operation. Here, a circuit for resetting the bit lines BL0 to BL2 to the ground voltage Vss is not illustrated.

As described above, the continuous refresh operation for the pages P0 to P2 can be performed in a state in which the voltages of the bit lines BL0 to BL2 are maintained at the third voltage V3. Since the pages P0 to P2 do not simultaneously perform the refresh operation, a peak current for the refresh operation is significantly reduced. In addition, it is possible to significantly reduce a dI/dt noise due to concentration of refresh operations of the pages P0 to P2. As a result, a stable refresh operation with a small noise $\Delta V = dI/dt \times L$ due to an inductance L of a memory chip internal line and a memory chip mounting board line can be implemented.

Figure 2H:
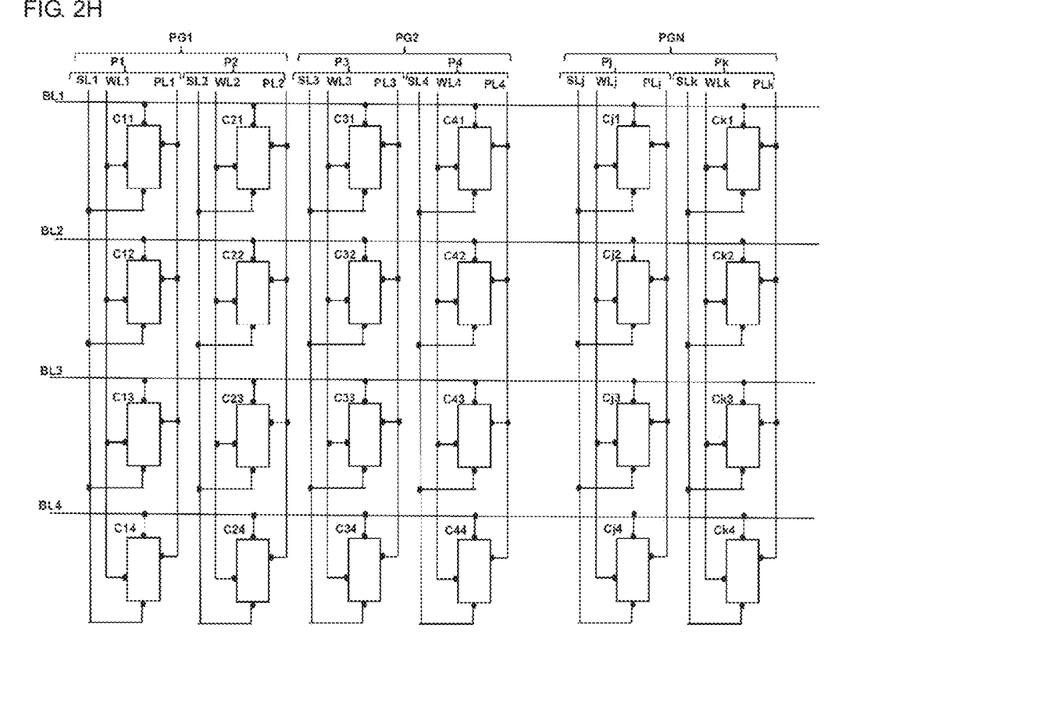
FIG. 2H is a diagram for explaining the refresh operation of the memory device according to the first embodiment.

FIG. 2H illustrates an example in which each page group is constituted by two pages. A first page group PG1 (an example of "first page group" in the claims), a second page group PG2, and an N-th page group PGN (an example of "N-th page group" in the claims) are respectively constituted by pages P1 and P2, pages P3 and P4, and pages Pj and Pk. Herein, N is a given integer of 2 or more. Each of word lines WL1 to WL4, WLj, and WLk, each of plate lines PL1 to PL4, PLj, and PLk, and each of source lines SL1 to SL4, SLj, and SLk belong to a corresponding one of the pages P1, P2, P3, P4, Pj, and Pk. Memory cells C11 to Ck4 are connected to bit lines BL1 to BL4. In FIG. 2H, the refresh operation is continuously performed in units of page groups.

Although the page group is constituted by two pages in FIG. 2H, the page group may be constituted by at least one page. In addition, the number of pages constituting the page group may be changed depending on the ambient temperature.

Figure 2I:
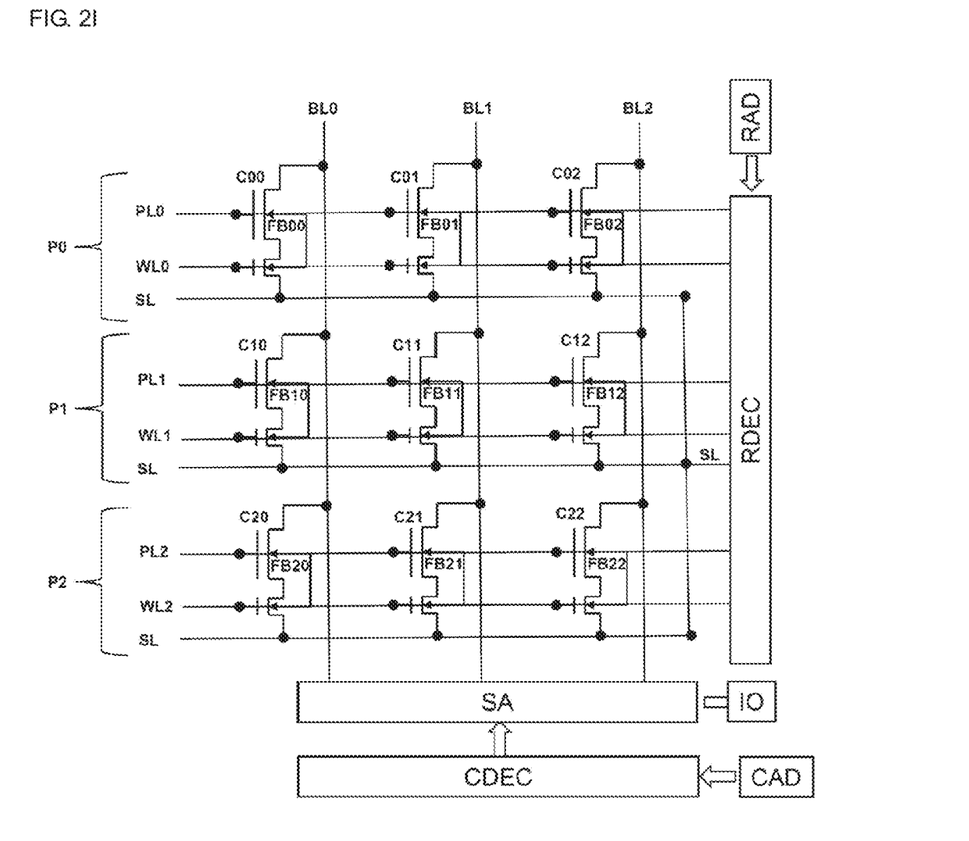
FIG. 2I is a diagram for explaining the refresh operation of the memory device according to the first embodiment.

As illustrated in FIG. 2I, the source line SL may be connected in common to all the memory cells of adjacent pages among the pages. As a result, the degree of freedom in design and process is increased.

In FIG. 1, even if a horizontal cross-sectional shape of the Si pillar 2 is a circular shape, an elliptical shape, or a rectangular shape, the dynamic flash memory operation described in this embodiment can be performed. In addition, dynamic flash memory cells of a circular shape, an elliptical shape, and a rectangular shape may be mixed on the same chip.

In FIG. 1, a dynamic flash memory element is described by taking an example of the SGT in which the first gate insulating layer 4a and the second gate insulating layer 4b surrounding the entire side surface of the Si pillar 2 standing in the vertical direction on the substrate are provided, and the first gate conductor layer 5a and the second gate conductor layer 5b surrounding the entirety of the first gate insulating layer 4a and the second gate insulating layer 4b are provided. As described in the present embodiment, the dynamic flash memory element may have any structure as long as it satisfies the condition that the group of positive holes 9 generated by the impact ionization phenomenon are retained in the semiconductor base 7. For this purpose, the semiconductor base 7 may have a floating body structure electrically isolated from a substrate 1. Thus, the above-described dynamic flash memory operation can be performed even if the semiconductor base is formed horizontally with respect to the substrate 1 (so that the central axis of the semiconductor base is parallel to the substrate) by using, for example, the GAA (Gate All Around: see, for example, J. Y. Song, W. Y. Choi, J. H. Park, J. D. Lee, and B-G. Park: "Design Optimization of Gate-All-Around (GAA) MOSFETs," IEEE Trans. Electron Devices, Vol. 5, No. 3, pp. 186-191, (2006)) technology, which is one type of SGT, or the Nanosheet technology (see, for example, N. Loubet, et al.: "Stacked Nanosheet Gate-All-Around Transistor to Enable Scaling Beyond FinFET," 2017 IEEE Symposium on VLSI Technology Digest of Technical Papers, T17-5, T230-T231, (2017)). In addition, a structure in which a plurality of GAAs and Nanosheets formed horizontally are laminated may be used. In addition, a device structure using SOI (Silicon On Insulator) (for example, see J. Wan, C. Le Royer, A. Zaslavsky, and S. Critoloveanu: "A Compact Capacitor-Less High-Speed DRAM Using Field Effect-Controlled Charge Regeneration," IEEE Electron Device Letters, Vol. 33, No. 2, pp. 179-181 (2012), T. Ohsawa, K. Fujita, T. Higashi, Y. Iwata, T. Kajiyama, Y. Asao, and K. Sunouchi: "Memory design using a one-transistor gain cell on SOI," IEEE JSSC, Vol. 37, No. 11, pp. 1510-1522 (2002), T. Shino, N. Kusunoki, T. Higashi, T. Ohsawa, K. Fujita, K. Hatsuda, N. Ikumi, F. Matsuoka, Y. Kajitani, R. Fukuda, Y. Watanabe, Y. Minami, A. Sakamoto, J. Nishimura, H. Nakajima, M. Morikado, K. Inoh, T. Hamamoto, and A. Nitayama: "Floating Body RAM Technology and its Scalability to 32 nm Node and Beyond," IEEE IEDM (2006), and E. Yoshida and T. Tanaka: "A Capacitorless 1T-DRAM Technology Using Gate-Induced Drain-Leakage (GIDL) Current for Low-Power and High-Speed Embedded Memory," IEEE IEDM (2003)) may be used. In this device structure, a bottom portion of the semiconductor base is in contact with an insulating layer of an SOI substrate, and another semiconductor base is surrounded by a gate insulating layer and an element isolation insulating layer. Also in this structure, the semiconductor base has the floating body structure. As described above, in the dynamic flash memory element provided by the present embodiment, the condition that the semiconductor body has the floating body structure may be satisfied. Even in a structure in which a Fin transistor (see, for example, H. Jiang, N. Xu, B. Chen, L. Zeng, Y. He, G. Du, X. Liu, and X. Zhang: "Experimental investigation of self heating effect (SHE) in multiple-fin SOI FinFETs," Semicond. Sci. Technol. 29 115021 pp. 7 (2014)) is formed on an SOI substrate, the dynamic flash memory operation can be performed as long as the semiconductor base has the floating body structure.

In FIG. 1, in the direction perpendicular to the substrate, the potential distribution of the first semiconductor base 7a and the potential distribution of the second semiconductor base 7b are connected in a portion of the semiconductor base 7 surrounded by the insulating layer 6. As a result, the semiconductor base 7 of the first semiconductor base 7a and the second semiconductor base 7b are connected in the vertical direction in the region surrounded by the insulating layer 6.

In FIG. 1, it is desirable that the vertical dimension of the first gate conductor layer 5a connected to the plate line PL be longer than the vertical dimension of the second gate conductor layer 5b connected to the word line WL to satisfy $C_{PL} > C_{WL}$. However, only by adding the plate line PL, the coupling ratio ($C_{WL}/(C_{PL}+C_{WL}+C_{BL}+C_{SL})$) of the capacitive coupling of the word line WL to the semiconductor base 7 is reduced. As a result, a potential variation $\Delta V_{FB}$ of the semiconductor base 7 of the floating body is reduced.

In the present specification and claims, the meaning of "cover" in a case where "a gate insulating layer, a gate conductor layer, or the like covers a channel or the like" includes a case where the gate insulating layer, the gate conductor layer, or the like entirely covers the channel or the like as in an SGT or a GAA, a case where the gate insulating layer, the gate conductor layer, or the like partly covers the channel or the like as in a Fin transistor, and a case where the gate insulating layer, the gate conductor layer, or the like overlaps with the channel or the like as in a planar transistor.

In FIG. 1, the first gate conductor layer 5a may be divided into two or more isolated gate conductor layers in plan view or in the vertical direction, and the respective isolated gate conductor layers may be operated as conductor electrodes of the plate line synchronously or asynchronously with the same driving voltage or different driving voltages. Similarly, the second gate conductor layer 5b may be divided into two or more isolated gate conductor layers in plan view or in the vertical direction, and the respective isolated gate conductor layers may be operated as conductor electrodes of the word line synchronously or asynchronously with the same driving voltage or different driving voltages. Also in the above manner, the dynamic flash memory operation is performed. If the first gate conductor layer 5a is divided into two or more isolated gate conductor layers, at least one of the isolated gate conductor layers serves as the first gate conductor layer 5a. Also, if the second gate conductor layer 5b is divided into two or more isolated gate conductor layers, at least one of the isolated gate conductor layers serves as the second gate conductor layer 5b. In addition, in the vertical direction, the isolated gate conductor layers of one of the first gate conductor layer 5a and the second gate conductor layer 5b may be arranged on both sides of the other of the first gate conductor layer 5a and the second gate conductor layer 5b.

In FIG. 1, the first gate conductor layer 5a may be connected to the word line WL, and the second gate conductor layer 5b may be connected to the plate line PL. Also in the above manner, the above-described dynamic flash memory operation can be performed. Similarly, in memory cells constituting the memory block in FIG. 2A, even if the plate lines PL0 to PL2 are provided on the bit lines BL0 to BL2 side, or even if the word lines WL0 to WL2 are provided on the bit lines BL0 to BL2 side, the above-described dynamic flash memory operation can be performed.

In addition, the above conditions of the voltages applied to the bit line BL, the source line SL, the word line WL, and the plate line PL and the voltage of the floating body are examples for performing basic operations of the erase operation, the write operation, and the read operation. Other voltage conditions may be used as long as the basic operations of the present invention can be performed.

In addition, a junctionless structure may be used in which the $N^+$ layers 3a and 3b of the dynamic flash memory cell illustrated in FIG. 1 have the same conductivity as that of the semiconductor base 7, which is a P layer. This also applies to the other embodiments.

Features

The present embodiment has the following features.

The features are in the continuous refresh operation in the dynamic flash memory cell according to the first embodiment of the present invention. In the present invention, in the memory cell storing the logical data "1" in the first page group including at least one page, the refresh operation is performed in which the number of positive holes of the group of positive holes in the semiconductor base is increased by the impact ionization phenomenon using a current flowing from the bit line to the memory cell. Then, in a state in which the voltage applied to the bit line is fixed, the refresh operation is continuously performed on the second page group and the N-th page group. In the above manner, since the plurality of page groups do not simultaneously perform the refresh operation, the peak current for the refresh operation is significantly reduced. As a result, heat generation of the memory chip is suppressed. In addition, it is possible to significantly reduce the dI/dt noise caused by instant flow of a large current due to concentration of refresh operations of the page groups. That is, the noise ($\Delta V = dI/dt \times L$) due to the inductance L of the memory chip internal line and the memory chip mounting board line can be reduced. In addition, by continuously performing the refresh operation on the page groups in a state in which the voltage applied to the bit line is fixed, a charge/discharge current and a charge/discharge time of the bit line can be significantly reduced. Therefore, a high-speed, low-power-consumption, and high-reliability memory device can be provided.

Other Embodiments

Although the Si pillar is formed in the present invention, a semiconductor pillar made of a semiconductor material other than Si may be used. This also applies to the other embodiments according to the present invention.

In addition, in "1" writing, pairs of electrons and positive holes may be generated by using a gate induced drain leakage (GIDL) current described in E. Yoshida and T. Tanaka: "A Capacitorless 1T-DRAM Technology Using Gate-Induced Drain-Leakage (GIDL) Current for Low-Power and High-Speed Embedded Memory," IEEE IEDM (2003), and the floating body may be filled with the generated group of positive holes. This also applies to the other embodiments according to the present invention.

In FIG. 1, the dynamic flash memory operation is performed even in a structure in which the polarities of the conductivity types of the N$^+$ layers 3a and 3b and the P-layer Si pillar 2 are reversed. In this case, the majority carriers are electrons in the Si pillar 2 which is N-type. Therefore, a group of electrons generated by the impact ionization are accumulated in the semiconductor base 7, and the "1" state is set.

In addition, the memory block may be formed by arranging the Si pillars of the memory cells two dimensionally in a square lattice pattern or an oblique lattice pattern. In a case where the Si pillars are arranged in an oblique lattice pattern, the Si pillars connected to one word line may be arranged in a zigzag pattern or a sawtooth pattern with a plurality of Si pillars as one side. This also applies to the other embodiments.

In addition, various embodiments and modifications can be made to the present invention without departing from the broad spirit and scope of the present invention. Furthermore, each of the above-described embodiments is intended to describe an example of the present invention, and does not limit the scope of the present invention. The above-described embodiments and modifications can be freely combined. Furthermore, even if some of the constituent features of the above-described embodiments are removed as necessary, it is within the scope of the technical idea of the present invention.

With the memory device using a semiconductor element according to an embodiment of the present invention, a dynamic flash memory which is a memory device using a high-density and high-performance SGT can be obtained.

What is claimed is:

1. A memory device using a semiconductor element in which, in plan view, a plurality of pages are arranged in a column direction on a substrate, each of the plurality of pages including a plurality of memory cells arranged in a row direction, wherein each of the memory cells included in each of the pages comprises:
a semiconductor base standing vertically or extending horizontally on the substrate;
a first impurity region and a second impurity region at both ends of the semiconductor base;
a gate insulating layer in contact with a side surface of the semiconductor base between the first impurity region and the second impurity region;
a first gate conductor layer covering a part or an entirety of the gate insulating layer; and
a second gate conductor layer adjacent to the first gate conductor layer and in contact with a side surface of the gate insulating layer,
a page erase operation, a page write operation, and a page read operation are to be performed by controlling voltages applied to the first impurity region, the second impurity region, the first gate conductor layer, and the second gate conductor layer,
among the memory cells, in any memory cell storing logical data "1" in a first page group including at least one page of the pages, a refresh operation is to be performed, the refresh operation being an operation in which a number of positive holes of a group of positive holes in the semiconductor base is increased by an impact ionization phenomenon with a current flowing from the second impurity region to the semiconductor base, and
in a state in which the voltage applied to the second impurity region is fixed, the refresh operation in which the number of positive holes is increased by the impact ionization phenomenon is to be performed continuously from the first page group to an N-th page group (N is a given integer of 2 or more).

2. The memory device using the semiconductor element according to claim 1, wherein
in each of the memory cells, the first impurity region is connected to a source line, the second impurity region is connected to a bit line, one of the first gate conductor layer and the second gate conductor layer is connected to a word line, and an other of the first gate conductor layer and the second gate conductor layer is connected to a plate line.

3. The memory device using the semiconductor element according to claim 2, wherein
in the page erase operation to be performed by controlling voltages applied to the source line, the bit line, the word line, and the plate line, some of the group of positive holes in the semiconductor base of the memory cells of the page are eliminated to reduce the number of positive holes remaining in the semiconductor base, and
in the page write operation to be performed by controlling the voltages applied to the source line, the bit line, the word line, and the plate line, the number of positive holes remaining in the semiconductor base of a selected memory cell among the memory cells of the page is increased by the impact ionization phenomenon.

4. The memory device using the semiconductor element according to claim 2, wherein
when the refresh operation is performed continuously from the first page group to the N-th page group, in a state in which the voltage applied to the bit line is fixed, all the word lines, all the plate lines, and all the source lines belonging to each of the first page group to the N-th page group are selected.

5. The memory device using the semiconductor element according to claim 1, wherein
all storage data after the page erase operation becomes logical data "0", and
storage data after the page write operation becomes the logical data "1" in the memory cell storing the logical data "1".

6. The memory device using the semiconductor element according to claim 2, wherein
the word line and the plate line are arranged in parallel in plan view, and
the bit line is arranged in a direction perpendicular to the word line and the plate line in plan view.

7. The memory device using the semiconductor element according to claim 2, wherein
a first gate capacitance between the semiconductor base and the other of the first gate conductor layer and the second gate conductor layer, to which the plate line is connected, with a first gate insulating layer interposed therebetween is larger than a second gate capacitance between the semiconductor base and the one of the first gate conductor layer and the second gate conductor layer, to which the word line is connected, with a second gate insulating layer interposed therebetween.

8. The memory device using the semiconductor element according to claim 2, wherein
the source line is isolated for each of the memory cells arranged in the row direction and is arranged in parallel with the word line and the plate line in plan view.

9. The memory device using the semiconductor element according to claim 2, wherein
the source line is connected in common to all the memory cells of adjacent pages among the pages in plan view.

10. The memory device using the semiconductor element according to claim 1, wherein
the semiconductor base is a P-type semiconductor layer, and the first impurity region and the second impurity region are N-type semiconductor layers.

11. The memory device using the semiconductor element according to claim 1, wherein
data in all the memory cells connected to at least two pages among the pages is erased in the page erase operation.

12. The memory device using the semiconductor element according to claim 2, wherein
the word line and the plate line are connected to a row decoder circuit, a row address is to be input to the row decoder circuit, and any page among the pages is to be selected in accordance with the row address.

13. The memory device using the semiconductor element according to claim 2, wherein
the bit line is connected to a sense amplifier circuit with a switch circuit interposed therebetween, the sense amplifier circuit is connected to a column decoder circuit, a column address is to be input to the column decoder circuit, and the sense amplifier circuit is to be selectively connected to an input/output circuit in accordance with the column address.

14. The memory device using the semiconductor element according to claim 1, wherein
one or both of the first gate conductor layer and the second gate conductor layer are divided into two or more isolated gate conductor layers in plan view or in a vertical direction, and the isolated gate conductor layers are to be operated synchronously or asynchronously.

15. The memory device using the semiconductor element according to claim 14, wherein
in plan view or in the vertical direction, the isolated gate conductor layers of one of the first gate conductor layer and the second gate conductor layer are arranged on both sides of an other of the first gate conductor layer and the second gate conductor layer.

* * * * *